(12) United States Patent
Lin

(10) Patent No.: US 6,429,538 B1
(45) Date of Patent: Aug. 6, 2002

(54) METHOD FOR MAKING A NOVEL GRADED SILICON NITRIDE/SILICON OXIDE (SNO) HARD MASK FOR IMPROVED DEEP SUB-MICROMETER SEMICONDUCTOR PROCESSING

(75) Inventor: Shih-Chi Lin, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/920,606

(22) Filed: Aug. 2, 2001

Related U.S. Application Data

(62) Division of application No. 09/726,658, filed on Nov. 30, 2000, now Pat. No. 6,287,962.

(51) Int. Cl.⁷ .............................................. H01L 23/544
(52) U.S. Cl. .......................... 257/797; 257/437; 257/915
(58) Field of Search ................................. 257/797, 437, 257/915; 438/723, 952

(56) References Cited

U.S. PATENT DOCUMENTS

| | | | |
|---|---|---|---|
| 5,510,290 A | 4/1996 | Kwon | 437/69 |
| 5,523,255 A | 6/1996 | Hyung et al. | 437/69 |
| 5,616,401 A | 4/1997 | Kobayashi et al. | 428/212 |
| 5,629,043 A | 5/1997 | Inaba et al. | 427/79 |
| 5,863,827 A | 1/1999 | Joyner | 438/425 |
| 6,019,906 A * | 2/2000 | Jang et al. | 216/2 |
| 6,093,973 A * | 7/2000 | Ngo et al. | 257/797 |
| 6,153,504 A * | 11/2000 | Shields et al. | 438/613 |
| 6,165,897 A * | 12/2000 | Jang | 438/637 |
| 6,165,898 A * | 12/2000 | Jang et al. | 438/638 |
| 6,235,456 B1 * | 5/2001 | Ibok | 257/437 |

* cited by examiner

Primary Examiner—Richard Elms
Assistant Examiner—Douglas M Menz
(74) Attorney, Agent, or Firm—George O. Saile; Stephen B. Ackerman

(57) ABSTRACT

A novel graded composite silicon nitride/silicon oxide (SNO) hard mask, and manufacturing method is achieved. This novel SNO film improves the profile (optical fidelity) of the photoresist etch mask image used to pattern the SNO film, and thereby improves the critical dimensions (CD) for deep submicrometer semiconductor circuits. After forming a stress release layer, such as a pad oxide layer, on a semiconductor substrate, the graded composite $Si_3N_4$—$SiO_2$ layer (SNO) is deposited by LPCVD and starting with $SiH_4$ and $NH_3$ as reactant gases. A nitrogen (N) rich film ($Si_3N_4$) is formed on the pad oxide layer. During deposition the $NH_3$ flow rate is reduced and $N_2O$ is introduced to form a graded silicon oxynitride (SiON) film which has an oxygen-rich film ($SiO_2$) at the top surface of the SNO layer. This SiON film modifies (reduces) the adsorption constant at the surface of the SNO layer. When the photoresist etch mask is formed on the SNO layer by exposing a photoresist layer with DUV radiation (through a reticle or photomask) and developed, the decomposition of the photoresist at the photoresist-hard-mask interface is minimized. This eliminates the need for an additional plasma treatment in oxygen of a $Si_3N_4$ hard mask used in the prior art.

5 Claims, 1 Drawing Sheet

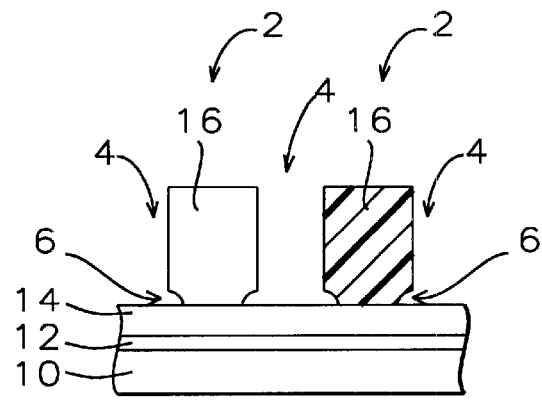
*FIG. 1 - Prior Art*
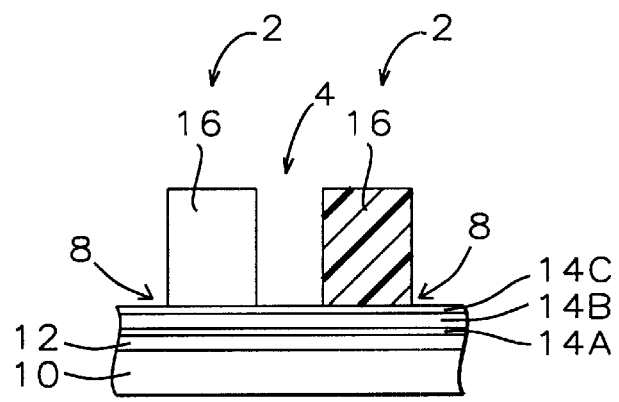
*FIG. 2*
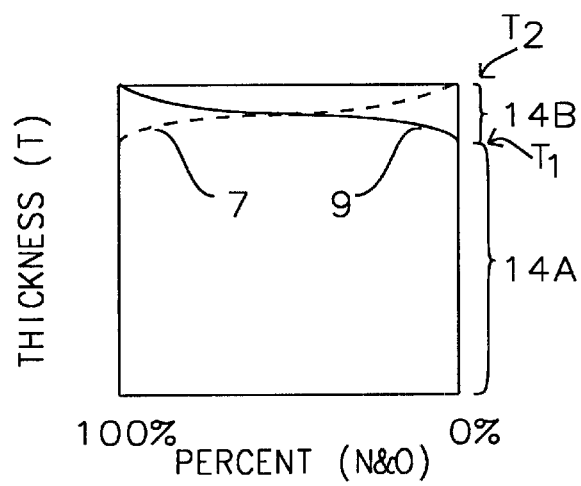
*FIG. 3*

METHOD FOR MAKING A NOVEL GRADED SILICON NITRIDE/SILICON OXIDE (SNO) HARD MASK FOR IMPROVED DEEP SUB-MICROMETER SEMICONDUCTOR PROCESSING

This is a division of patent application Ser. No. 09/726,658, filing date Nov. 30, 2000 now U.S. Pat. No. 6,287,962, Method For Making A Novel Graded Silicon Nitride/Silicon Oxide (Sno) Hard Mask For Improved Deep Submicrometer Semiconductor Processing, assigned to the same assignee as the present invention.

BACKGROUND OF THE INVENTION (1) Field of the Invention

The present invention relates to the fabrication of integrated circuits, and more particularly to a method for forming a novel graded silicon nitride ($Si_3N_4$)/silicon oxide ($SiO_2$) (also referred to as SNO) hard mask on a substrate. This novel SNO layer improves the profile (optical fidelity) of the photoresist etch mask image used to pattern the SNO layer, and thereby improves the critical dimensions (CD) for deep submicrometer semiconductor circuits.

(2) Description of the Prior Art

As the minimum feature sizes continue to decrease to deep submicrometer (um) dimensions (0.10–0.20 um) for making Ultra Large Scale Integration (ULSI) circuits, it is necessary to further improve the fidelity of the photoresist mask images used to etch the various material layers formed on semiconductor substrates. One of these layers is the silicon nitride ($Si_3N_4$) used as an oxidation barrier and/or hard mask on a single-crystal silicon substrate. In the conventional process a relatively thin pad oxide (e.g.,$SiO_2$) is formed on the surface of the silicon substrate, and a $Si_3N_4$ layer is deposited. The $Si_3N_4$ is patterned using a photoresist mask and plasma etching to leave portions of the $Si_3N_4$ over the device areas while removing portions on the silicon substrate surface around the device areas. A field oxide is formed around the device areas to electrically isolate the individual device areas from each other. The interposing pad oxide serves to reduce the high stress from the $Si_3N_4$ which would otherwise cause crystalline defects in the single-crystal silicon. In early versions of the process, the field oxide was formed by thermally oxidizing the silicon in the field oxide areas, while the patterned $Si_3N_4$ protected the device areas from oxidation. This conventional approach is commonly referred to in the industry as the LOCal Oxidation of Silicon (LOCOS) process. Unfortunately, the LOCOS process is an essentially isotropic oxidation and results in lateral oxidation under the $Si_3N_4$ oxidation barrier mask, commonly referred to as "the bird's beak" because of it shape. This lateral oxidation is sensitive to the thickness of the pad oxide and limits the minimum feature size device areas. If the pad oxide is too thin, the stress from $Si_3N_4$ hard mask is unacceptably high causing silicon defects, and if the pad oxide is too thick the bird's beak extends too far under the oxidation barrier mask and limits the pattern density. Kobayashi et al. in U.S. Pat. No. 5,616,401 teaches several methods of reducing the bird's beak using a graded silicon oxynitride/silicon nitride isolation oxidation mask. In U.S. Pat. No. 5,510,290 to Kwon another approach is described. Kwon etches openings in a $Si_3N_4$ hard mask to a thin thermal silicon oxide over the field oxide areas and thermally converts the oxide to silicon oxynitride (SiON). Sidewall spacers are formed in the openings to reduce the width, and the SiON is etched to the silicon substrate, and a LOCOS is performed to crate narrow field oxides. Hyung et al. in U.S. Pat. No. 5,523,255 uses a polysilicon buffer layer between the pad oxide and the silicon nitride hard mask to reduce the length of the bird's beak. In U.S. Pat. No. 5,629,043, Inaba et al. teach a method for making a better thin $Si_3N_4$ interelectrode dielectric layer for stacked DRAM capacitors.

An alternative approach of making a field oxide isolation which eliminates the bird's beak and increases the density of device areas is to form a field oxide isolation, commonly referred to as a shallow trench isolation (STI). This approach eliminates the bird's beak and is more desirable for deep submicrometer processing. In this method a $Si_3N_4$ and the photoresist mask protect the device areas while the exposed silicon is anisotropically etched in the field oxide areas to form trenches having essentially vertical sidewalls. After removing the photoresist it is common practice to grow a sacrificial oxide and wet etch the oxide to remove any silicon damaged due to the plasma etching, and then a new thin oxide is grown to provide a good interface at the silicon surface. The trench is then filled with a chemical vapor deposited (CVD) silicon oxide and etched or polished back to the $Si_3N_4$ hard mask. This STI structure circumvents the bird's beak problem and provides a planar substrate surface that is ideal for subsequent processing steps.

However, to achieve deep submicrometer feature sizes it is necessary to make reliable and reproducible photoresist mask images on the $Si_3N_4$ hard mask. One problem associated with making reliable well shaped photoresist images is best understood by referring to the prior art of FIG. 1. In FIG. 1 a silicon substrate 10 typically has a pad oxide 12 formed on the surface to reduce stress, and then a $Si_3N_4$ layer 14 is deposited. A blanket photoresist layer 16 is spin coated and is optically exposed and developed to leave portions of the photoresist over device areas 2 on the substrate 10, while exposing the $Si_3N_4$ 14 in the areas 4. This photoresist mask and plasma etching are then used to etch the $Si_3N_4$ and trenches in the substrate for the STI field oxide. To etch deep submicrometer structures the patterned photoresist layer 16 should have an essentially vertical profile down to the $Si_3N_4$ hard mask layer 14. However, because of interactions between the patterned photoresist layer 16 and the nitride layer when exposed with the short wavelength deep ultraviolet (DUV) light, unwanted undercutting or lateral recessing 6 occurs in the photoresist at the $Si_3N_4$ surface during photoresist developing. These recesses 6 make it difficult to etch reliable submicrometer images in the $Si_3N_4$ layer 14. To avoid this problem it is a common practice in the semiconductor industry to plasma treat the surface with oxygen ($O_2$) prior to patterning the photoresist.

One method of making shallow trench isolation (STI) is described in U.S. Pat. No. 5,863,827 to Joyner. The invention utilizes a method for making rounded trench corners to minimize the electric field effects when the circuit is powered on. However, Joyner does not address the need for forming photoresist patterns which are free of recesses 6 as described above with reference to FIG. 1.

However, there is still a need in the semiconductor industry to improve the $Si_3N_4$ hard mask etch process while providing a more cost-effective manufacturing process.

SUMMARY OF THE INVENTION

A principal object of this invention is to make a novel graded silicon nitride-silicon oxide (SNO) hard mask. This novel hard mask layer reduces the reflective index of the hard mask, and allows photoresist images to be formed on the hard mask layer with an improved shape. The photoresist image is formed having essentially vertical sidewalls and without recesses formed in the photoresist mask at the photoresist hard-mask layer interface, that would otherwise occur in the conventional process, as depicted in the prior art FIG. 1.

The method for making this improved graded composite silicon nitride-silicon oxide (SNO) hard mask begins by providing a semiconductor substrate. The most commonly used substrate is a single-crystal silicon (Si) substrate. A stress release layer is formed on the principal surface of the silicon substrate. One method of forming a stress release layer is to thermally oxidize the silicon surface to form a thin $SiO_2$ layer. The graded composite silicon nitride-silicon oxide (SNO) hard mask layer is then formed by depositing a silicon nitride ($Si_3N_4$) film using a chemical vapor deposition tool and reactant gases of silane ($SiH_4$) and ammonia ($NH_3$). During the $Si_3N_4$ film deposition the flow rate of the $NH_3$ reactant gas is continuously reduced while a third reactant gas of nitrous oxide ($N_2O$) is introduced to form a silicon oxynitride (SiON) film. This results in a graded composite SNO layer which is nitrogen-rich ($Si_3N_4$) at the substrate surface and is continuously converted to a silicon oxynitride (SiON) that is oxygen-rich (essentially $SiO_2$) at the top surface of the SNO layer.

The SiON film on the top surface of the SNO layer will also reduce the reflective index. The introduction of $N_2O$ also reduces the hydrogen content which would otherwise react with the deep UV photoresist and cause notches in the bottom of the photoresist. This novel graded composite silicon nitride-silicon oxide (SNO) layer eliminates the need to plasma treat in oxygen the $Si_3N_4$ hard mask layer used in the conventional process. A photoresist layer is deposited on the SNO layer by spin coating. Conventional processing is then used to optically expose the photoresist through a photomask (reticule), and the photoresist is developed to from the photoresist etch mask for etching the SNO layer. Since the adsorption constant of the SNO is lower and the hydrogen content on the top surface of the SNO are lower, the photoresist etch mask has vertical sidewalls. The need to use an additional plasma treatment on a conventional $Si_3N_4$ hard-mask layer to reduce the reflective index and to reduce the hydrogen content of the $Si_3N_4$ is eliminated. The photoresist etch masks can now be used for etching deep submicrometer patterns in the SNO layer.

BRIEF DESCRIPTION OF THE DRAWINGS

The preferred embodiment of this invention is best understood with reference to the attached drawings that include:

FIG. 1 shows a schematic cross-sectional view by the prior art of a patterned photoresist layer on a $Si_3N_4$ hard-mask layer with undesirable recesses in the photoresist pattern at the photoresist/hard-mask interface.

FIG. 2 shows a schematic cross-sectional view of a patterned photoresist layer on the novel SNO layer formed by the method of this invention.

FIG. 3 is a graph showing the compositional change in the nitrogen and oxygen of the SNO layer along the horizontal axis (x-axis) vs the thickness of the SNO layer along the vertical axis (y-axis) for the embodiment of this invention.

DESCRIPTION OF THE PREFERRED EMBODIMENT

The method for making a novel graded composite silicon nitride-silicon oxide (SNO) hard mask layer is now described in detail. The oxygen-rich SNO surface makes forming deep submicrometer images in patterned photoresist with high fidelity and essential vertical sidewall possible. The reduced reflectively of the SNO layer to deep ultraviolet (DUV) radiation during exposure of the photoresist eliminates recessing (notching) of the photoresist etch mask during development. Although the SNO layer is particularly useful as a hard-mask layer over the device areas for forming a field oxide, it should be understood by those skilled in the art that the method and structure are useful in general where deep submicrometer patterning in a hard-mask layer is required.

Referring to FIG. 2, the invention beings by providing a semiconductor substrate 10. The substrate commonly used in the industry is a $P^-$ doped single-crystal silicon with a <100> preferred crystallographic orientation. A stress release layer 12 is formed on the surface of the silicon substrate 10. The stress release layer 12 is typically a pad oxide and serves to reduces the stress on the silicon substrate 10 due to the hard-mask layer 14. Typically the pad oxide is silicon oxide ($SiO_2$) and is formed by thermal oxidation in an oxidation furnace. Typically the pad oxide 12 is grown in a dry oxygen at a temperature of between about 900 and 1000 degrees centigrade (° C.). The pad oxide is deposited to a preferred thickness of between about 100 and 250 Angstroms.

Still referring to FIG. 2, and by the method of this invention, the graded composite silicon nitride-silicon oxide hard-mask layer 14, hereafter referred to as the SNO layer, is formed on the pad oxide 12. The method starts by depositing a silicon nitride ($Si_3N_4$) film 14A. The $Si_3N_4$ layer is preferably deposited by low pressure chemical vapor deposition (LPCVD) in a reactor using silane ($SiH_4$) and ammonia ($NH_3$) as the reactant gases, and is deposited at a temperature of between about 750 and 850° C. After depositing the $Si_3N_4$ to a thickness $T_1$, the flow rate of the $NH_3$ is decreased and a new reactant gas, nitrous oxide ($N_2O$), is introduced into the reactor to form a silicon oxynitride ($SiO_xN_y$) film 14B to a thickness $T_2$, in which the x increases and y decreases continuously with increasing thickness. The process is continued to complete the formation of an oxygen-rich silicon oxynitride (SiON) on the top surface 14B of the hard-mask layer 14.

Referring to FIG. 3, the graph shows a plot of the percent of nitrogen (N) and Oxygen (O) in the SNO layer 14 (14A and 14B) along the horizontal axis vs. the thickness (T) of SNO layer 14 along the vertical axis. The horizontal axis of the graph is 100 percent at the left of the graph and goes to 0 percent at the right edge of the graph. The thickness T of the SNO is normalized to 1.0 on the vertical axis, but preferable the total thickness T is between about 1200 and 2000 Angstroms. The dashed line 7 shows the change of the percent of nitrogen (N) in the SNO as a function of thickness and the solid line 9 shows the change in the percent of oxygen as a function of thickness.

The thickness and the composition profiles of the films 14A and 14B of the SNO layer can be optimized to minimize the adsorption constant at the SNO surface for the DUV radiation used to expose the photoresist.

Since the deposition of the graded composite SNO hard mask is carried out in a single deposition step, the need for a separate plasma treatment of a $Si_3N_4$ in oxygen, as required in the prior art, is not necessary. Therefore, this inventive process method is more manufacturing cost effective Referring back to FIG. 2, after forming the SNO layer 14, a high-resolution photoresist layer 16 is deposited, for example by spin coating. For example, one type of DUV photoresist that can be used is SEPR432 manufactured by Shinatu of Japan. Conventional photolithographic techniques are then used to expose the photoresist through a photomask (reticle) using deep ultraviolet (DUV) radiation (having a wavelength of about 0.248 um) and the photoresist is then developed to achieve deep submicrometer (0.10 to 0.20 um) images in the photoresist. The reduction in the DUV coefficient of reflectivity at the top surface of the SNO layer 14 eliminates recesses in the patterned photoresist 16 at the interface (point 8) in FIG. 2 that would otherwise occur, as depicted by the recesses 6 in the schematic cross-sectional view in the prior art of FIG. 1.

While the invention has been particularly shown and described with reference to the preferred embodiment thereof, it will be understood by those skilled in the art that various changes in form and details may be made without departing from the spirit and scope of the invention.

What is claimed is:

1. A graded composite silicon nitride-silicon oxide hard-mask layer on a semiconductor substrate comprised of:
   a stress release layer on said substrate;
   a silicon nitride film on said stress release layer, said silicon nitride film changes continuously in composition with increasing thickness through a silicon oxynitride phase to an oxygen-rich film at the top surface of said graded composite silicon nitride-silicon oxide hard-mask layer;
   a photoresist mask having vertical sidewalls on said graded composite silicon nitride-silicon oxide hard-mask layer, said vertical sidewalls resulting from the reduced adsorption constant of said graded composite silicon nitride-silicon oxide hard mask when said photoresist mask is formed.

2. The structure of claim 1, wherein said semiconductor substrate is single-crystal silicon.

3. The structure of claim 1, wherein said stress release layer is a silicon oxide layer having a thickness of between about 100 and 250 Angstroms.

4. The structure of claim 1, wherein said graded composite silicon nitride-silicon oxide has a thickness of between about 1200 and 2000 Angstroms.

5. The structure of claim 1, wherein said grade composite silicon nitride-silicon oxide hard-mask layer reduces the reflective coefficient of ultraviolet radiation used to expose and form said photoresist mask with essentially vertical sidewalls of said photoresist mask.

* * * * *